US006377084B2

(12) United States Patent
Forbes

(10) Patent No.: US 6,377,084 B2
(45) Date of Patent: *Apr. 23, 2002

(54) PSEUDO-DIFFERENTIAL AMPLIFIERS

(75) Inventor: Leonard Forbes, Corvallis, OR (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/255,077

(22) Filed: Feb. 22, 1999

(51) Int. Cl.[7] .......................... G11C 7/06; H03K 3/356; H03K 17/687; H03F 3/45
(52) U.S. Cl. ......................... 327/55; 327/199; 327/391; 327/416; 327/103
(58) Field of Search ............................... 327/52–55, 57, 327/103, 199, 391, 415, 416, 434, 436, 437; 330/301; 365/207, 208

(56) References Cited

U.S. PATENT DOCUMENTS

| 4,575,686 A | * | 3/1986 | Palara et al. ................. 330/273 |
| 4,818,929 A | * | 4/1989 | Sonntag et al. ............. 330/257 |
| 5,309,047 A | | 5/1994 | Tiede et al. ................. 307/530 |

(List continued on next page.)

FOREIGN PATENT DOCUMENTS

| EP | 0397355 | 11/1990 | ............ G11C/7/06 |
| EP | 0594305 | 4/1994 | ........... H03K/3/353 |
| EP | 0681293 | 11/1995 | ............ G11C/7/00 |

OTHER PUBLICATIONS

Blennemann, H., et al., "Off–chip 400 Mbps signal transmission: noise reduction using non–resonant lengths and other techniques", Proceedings of the 1996 IEEE Multi–Chip Module Conference, 138–142, (1996).

Jaeger, et al., "A High–speed Sensing Scheme for 1T Dynamic RAMs Utilizing the Clamped Bit–line Sense Amplifier", IEEE Journal of Solid–State Circuits, vol. 27, No. 4, 618–625, (Apr. 1992).

Jaeger, R.C., et al., "A High–Speed Clamped Bit–Line Current–Mode Sense Amplifier", IEEE Journal of Solid–State Circuits vol. 26, No. 4, 542–548, (Apr. 1991).

(List continued on next page.)

Primary Examiner—Kenneth B. Wells
Assistant Examiner—Terry L. Englund
(74) Attorney, Agent, or Firm—Schwegman, Lundberg, Woessner & Kluth, P.A.

(57) ABSTRACT

Single input receivers and "pseudo differential" amplifiers can conserve scarce chip surface area and still provide fast response times in a low power CMOS environment. A first embodiment includes a single ended receiver. The single ended receiver includes a pair of cross coupled inverters. Each of the inverters includes a pair of output transmission lines. A single signal input node coupled to a source region for one of the pair of cross coupled inverters and to a current mirror such that the single ended receiver is able to convert a single ended input current received at the single signal input node into a differential input signal. A second embodiment includes a pseudo differential amplifier. The pseudo differential amplifier includes a pair of cross coupled transistors. The pseudo differential amplifier includes a pair of signal output nodes. A single signal input node is coupled to a source region for one of the transistors in the pair of cross coupled transistors and to a current mirror such that the pseudo differential amplifier is able to convert a single ended input current received at the single signal input node into a differential input signal. Methods of operation and methods of forming the single ended receivers and pseudo differential amplifiers are similarly included. The single ended receivers and pseudo differential amplifiers are fabricated in a streamlined CMOS process and provide responsive performance for single input current signal 2.0 mA and lower.

76 Claims, 7 Drawing Sheets

U.S. PATENT DOCUMENTS

| | | | | |
|---|---|---|---|---|
| 5,359,727 A | * | 10/1994 | Kurita et al. | 331/10 |
| 5,371,421 A | * | 12/1994 | Kondoh et al. | 326/73 |
| 5,390,147 A | | 2/1995 | Smarandoiu et al. | 365/185 |
| 5,627,789 A | * | 5/1997 | Kalb, Jr. | 365/205 |
| 5,687,123 A | | 11/1997 | Hidaka et al. | 365/189.09 |
| 5,789,981 A | | 8/1998 | Singer et al. | 330/253 |
| 5,793,230 A | | 8/1998 | Chu et al. | 327/77 |
| 5,834,951 A | * | 11/1998 | Klein | 327/53 |
| 5,841,718 A | * | 11/1998 | Watters et al. | 365/208 |
| 5,850,365 A | | 12/1998 | Reese et al. | 365/207 |
| 5,955,899 A | * | 9/1999 | Afghahi | 327/65 |
| 6,081,140 A | | 6/2000 | King | 327/77 |
| 6,130,579 A | * | 10/2000 | Iyer et al. | 330/285 |

OTHER PUBLICATIONS

Rabaey, J.M., "Digital Integrated Circuits, a Design Perspective", Prentice Hall Electronics and VLSI Series, p. 489, (1996).

Seevinck, E., et al., "Current–Mode Techniques for High–Speed VLSI Circuits with Application to Current Sense Amplifier for CMOS SRAM's", IEEE Journal of Solid–State Circuits, vol. 26, No. 4, 525–535, (Apr. 1991).

Zhang, H., et al., "Low–swing interconnect interface circuits", Symposium on Low Power Electronics and Design, Monterey, CA, 161–166, (Aug. 1998).

* cited by examiner

PSEUDO-DIFFERENTIAL AMPLIFIERS

FIELD OF THE INVENTION

The present invention relates generally to integrated circuits. More particularly, it pertains to structures and methods for pseudo differential amplifiers.

BACKGROUND OF THE INVENTION

It is important to provide impedance matching on signal interconnection lines (i.e. transmission lines) to avoid reflections and ringing on the transmission lines at high data rates. Many different techniques have been utilized in CMOS technology to reduce reflections and ringing on high speed interconnections, including limiting slew rates on signals, resistor terminations, diffused resistor terminations, using only non-resonant lengths on the transmission lines and using controlled impedance drivers. One technique for providing impedance matched terminations is to use current sense amplifiers and current mode sensing. In this technique, the current sense amplifier can be designed to provide a lower input impedance than the conventional voltage sense amplifiers which employ voltage sensing of the transmission line signals.

Presently, most CMOS integrated circuit interconnections rely on the transmission of a voltage step or signal from one location to another. The driver may simply be a CMOS inverter with a passive pull up load resistor and the receiver a simple CMOS amplifier, differential amplifier or comparator. The CMOS receiver presents a high impedance termination or load to the interconnection line. This fact is problematic for several identifiable reasons. In example, the high impedance termination is troublesome because the switching time response or signal delay is determined mainly by the ability of the driver to charge up the capacitance of the line and the load capacitance. Also, the interconnection line is not terminated by its characteristic impedance resulting in reflections and ringing. Thus, large noise voltages may be induced on the signal transmission line due to capacitive coupling and large voltage switching on adjacent lines. The result is that the noise voltage can be a large fraction of the signal voltage.

The transmission of voltage step signals works well if the interconnection transmission line is short so that the stray capacitance of the line is less. However, in longer low impedance transmission lines, such as those which exist on most CMOS integrated circuits, the noise voltage presents a difficult problem. These longer low impedance transmission lines are in fact more amenable to current signaling. These longer transmission lines may be on the CMOS integrated circuit itself, an interconnection line between integrated circuits mounted in a module as for instance a memory module, an interposer upon which these integrated circuits are mounted, or on a printed circuit board upon which the integrated circuits are mounted.

Independent of whether voltage signals or current-mode signals are employed two different types of interconnections exist, the first type includes single sided/single ended interconnections and the second type includes differential interconnections. Differential interconnections are often desirable in that they reduce common mode noise. However, differential interconnections require two interconnection transmission lines and, in I/O applications, they require twice as many input/output pads and packaging pins which is a problem in some applications. The requirement of two interconnection transmission lines creates twice as much crowding on the precious chip surface area available in certain CMOS applications. Single sided/single ended pseudo differential interconnections have some of the advantages of differential interconnections, like power supply noise rejection. Single sided/single ended pseudo differential interconnections use a single transmission line interconnection.

In the "quasi-differential" amplifier, a single transmission line interconnection is utilized and one input of the voltage sense amplifier driven with a reference potential. The "quasi-differential" technique, and with voltage sensing on a terminated line has been used in 400 Mbs CMOS systems. FIG. 1 provided a schematic for a conventional "pseudo-differential" amplifier. In the "pseudo-differential" amplifier technique one side of the different type of voltage sense amplifier is driven with a combination of ground potential and a reference potential. Unfortunately, achieving high data rates is difficult with single-ended or unbalanced signal transmission lines at high frequencies because of large amount of noise is generated in the interconnection system including crosstalk and radiation in backpanes, connectors and cables.

FIG. 2 provides an illustration of the conventional differential current sense amplifier. This conventional current sense amplifier, receiving fully differential input signals, can respond more rapidly than those single ended/single sided amplifiers mentioned above. Also, the fully differential sense amplifier has lower power constraints and can be driven with a small 0.5 mA input signal on the input transmission lines. The conventional differential current sense amplifier is not very responsive to single sided or single ended input signals where one side, or input, is driven with a reference current signal, e.g. zero Amperes and the other input is used in an attempt to detect a current signal. When used in such a manner the response of the current sense amplifier with a single sided input is very poor. There is simply not enough gain and feedback in the positive feedback latch to result in a large output signal for a 1 milliampere (mA) input signal. Instead a larger 5 mA input signal is required which places greater power demands on the overall CMOS circuit.

For the reasons stated above, and for other reasons stated below which will become apparent to those skilled in the art upon reading and understanding the present specification, it is desirable to develop improved single ended or "pseudo differential" amplifiers which can be fabricated according to a conventional CMOS process and provide responsive performance for current signal inputs of 2.0 mA and lower.

SUMMARY OF THE INVENTION

The above mentioned problems with CMOS integrated circuits as well as other problems are addressed by the present invention. Novel single ended receivers and "pseudo differential" amplifiers are provided which conserve scarce chip surface area yet still provide fast response times in a low power CMOS environment.

A first embodiment includes a single ended receiver. The single ended receiver includes a pair of cross coupled inverters. Each of the inverters includes a pair of output transmission lines. Each one of the pair of output transmission lines is coupled to a drain region on each one of the pair of cross coupled inverters. A single signal input node coupled to a source region for one of the pair of cross coupled inverters. The single signal input node is further coupled to a current mirror such that the single ended receiver is able to convert a single ended input current received at the single signal input node into a differential input signal. In this manner, the single ended receiver is able to latch a voltage output signal on the pair of output transmission lines when a current signal of 2.0 milliampere (mA) or less is received at the single signal input node.

A second embodiment includes a pseudo differential amplifier. The pseudo differential amplifier includes a pair of cross coupled transistors. The pseudo differential amplifier includes a pair of signal output nodes. Each one of the pair of signal output nodes is coupled to a drain region for each transistor in the cross coupled pair of transistors. Each one of the pair of signal output nodes is further coupled to a gate of the other transistor in the cross coupled pair of transistors. A single signal input node is coupled to a source region for one of the transistors in the pair of cross coupled transistors. The single signal input node is further coupled to a current mirror such that the pseudo differential amplifier is able to convert a single ended input current received at the single signal input node into a differential input signal. This novel pseudo differential amplifier can provide a differential voltage signal to the pair of signal output nodes when a single ended input current of 2.0 milliampere (mA) is received at the single signal input node.

These and other method embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1:
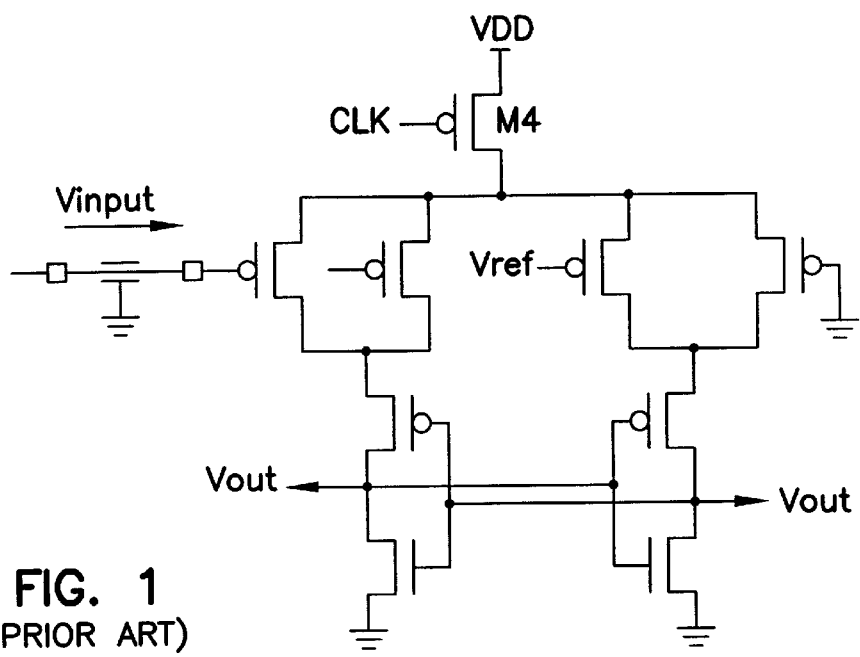
FIG. 1 is a schematic diagram illustrating a pseudo differential voltage according to the teachings of the prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the fall scope of equivalents to which such claims are entitled.

In particular, an illustrative embodiment of the present invention includes a single ended receiver. The single ended receiver includes a pair of cross coupled inverters. Each inverter includes a pair of output transmission lines. In each inverter the output transmission lines is coupled to a drain region for the inverter. Each inverter further has a single signal input node which is coupled to a source region for one of the pair of cross coupled inverters. In this embodiment, the single ended receiver is able to latch a voltage output signal on the pair of output transmission lines when a current signal of 2.0 milliampere (mA) or less is received at the single signal input node.

In another embodiment, a pseudo differential latch is provided. The pseudo differential latch includes a pair of cross coupled amplifiers. Each amplifier in the latch includes a first transistor of a first conductivity type which has a source region, a drain region, and a gate opposing a body region. A second transistor of a second conductivity type is included which has a source region, a drain region, and a gate opposing a body region. A signal output node is coupled to the drain regions for the first transistor and the second transistor. Each signal output node in each one of the cross coupled amplifiers is farther coupled to the gates of the first and the second transistors in the other amplifier. Each amplifier further includes a third transistor of a first conductivity type which has a source region, a drain region, and a gate opposing a body region. The drain region is coupled to the source region of the first transistor. The latch further includes a signal input node which is coupled to the source region for the first transistor in a first one of the cross coupled amplifiers. The signal input node is further coupled to the gate in each third transistor.

In another embodiment, a single ended receiver is provided. The single ended receiver includes a pair of cross coupled inverters. Each inverter includes a p-channel metal oxide semiconductor (PMOS) transistor and an n-channel metal oxide semiconductor (NMOS) transistor. The PMOS transistor and the NMOS transistor are coupled to one another at a drain region for the PMOS transistor and the NMOS transistor. A pair of output transmission lines are provided such that each one of the pair of output transmission lines is coupled to the drain regions on each one of the pair of cross coupled of inverters. A single input transmission line is coupled at a single input node to a source region of the NMOS transistor in one of the cross coupled inverters and a current mirror coupled to the single input node.

In another embodiment, a pseudo differential amplifier is provided. The pseudo differential amplifier includes pair of cross coupled inverters. Each inverter includes a p-channel metal oxide semiconductor (PMOS) transistor, a first n-channel metal oxide semiconductor (NMOS) transistor, and an output node. The output node couples a drain region for the PMOS transistor to a drain region for the first NMOS transistor. A single signal input node is coupled to a source region of the first NMOS transistor in one of the cross coupled inverters. In this embodiment, the pseudo differential amplifier is able to convert a single ended input current received at the single signal input node into a differential input signal.

In another embodiment, a single ended amplifier is provided. The single ended amplifier includes a pair of cross coupled metal oxide semiconductor field effect transistors (MOSFETs). A pair of signal output nodes is included such that each one of the pair of signal output nodes is coupled to a drain region for each MOSFET in the cross coupled pair of MOSFETs. A single signal input node is coupled to a source region for one of the MOSFETs in the cross coupled pair of MOSFETs. A current mirror is coupled to the single signal input node and a source region for each one of the cross coupled pair of MOSFETs.

In another embodiment an amplifier circuit is provided. The amplifier circuit includes a pair of cross coupled transistors. A pair of output transmission lines couple to the amplifier circuit such that each one of the pair of output transmission lines is coupled to a drain region on each one of the pair of cross coupled transistors. A single signal input node is coupled to a source region for one of the pair of cross coupled transistors. In this embodiment, the amplifier circuit is able to provide a differential voltage signal to the pair of output transmission lines when a single ended input current of less than 1.0 mA is received at the single signal input node.

In another embodiment, a pseudo differential amplifier is provided. The pseudo differential amplifier comprises a first pair of metal oxide semiconductor field effect transistors (MOSFETs). The first pair of MOSFETS are cross coupled. The pseudo differential amplifier includes a pair of load resistors. Each load resistor is coupled to a drain region for each MOSFET in the first pair of MOSFETs. A pair of signal output nodes is included such that each one of the pair of signal output nodes is coupled to the drain region for each MOSFET in the first pair of MOSFETs. A single signal input node is coupled to a source region for one of the MOSFETs in the first pair of MOSFETs. The pseudo differential amplifier further includes a second pair of MOSFETs. A drain region for each MOSFET in the second pair of MOSFETs is coupled to a source region for each MOSFET in the first pair of MOSFETs. The signal input node is coupled to a gate for each of the second pair of MOSFETs.

In another embodiment, an amplifier circuit is provided which comprises a pair of cross coupled n-channel metal oxide semiconductor (NMOS) transistors. The amplifier circuit includes a pair of output transmission lines, wherein each one of the pair of output transmission lines is coupled to a drain region on each one of the pair of cross coupled of NMOS transistors. A single input transmission line is coupled at a single input node to a source region on one of the NMOS transistor in the cross coupled pair of NMOS transistors. And, a current mirror coupled to the single input node.

In another embodiment, a pseudo differential amplifier is provided. The pseudo differential amplifier includes a pair of cross coupled transistors. The pseudo differential amplifier includes a pair of signal output nodes such that each one of the pair of signal output nodes is coupled to a drain region for each transistor in the cross coupled pair of transistors. A single signal input node is coupled to a source region for one of the transistors in the pair of cross coupled transistors. The pseudo differential amplifier is able to convert a single ended input current received at the single signal input node into a differential input signal.

In another embodiment, a single ended amplifier is provided which is made up from a pair of cross coupled amplifiers. Each of the cross coupled amplifiers includes a load resistor, a first transistor which has a source region, a drain region coupled to the load resistor, and a gate opposing a body region, a signal output node that is also coupled to the drain region for the first transistor, and a second transistor which has a source region, a drain region, and a gate opposing a body region. The drain region of the second transistor is coupled to the source region of the first transistor. The single ended amplifier further includes a signal input node which is coupled to the source region for the first transistor in one of the cross coupled amplifiers. The signal input node is further coupled to the gate in each second transistor.

In another embodiment, an electronic system is provided. The electronic system includes a processor, a memory device, and a bus coupling the processor and the memory device. The memory device further includes a single ended receiver. The single ended receiver comprises a pair of cross coupled inverters such that each inverter includes a p-channel metal oxide semiconductor (PMOS) transistor, and an n-channel metal oxide semiconductor (NMOS) transistor. The PMOS transistor and NMOS transistor are coupled to one another at a drain region for the PMOS transistor and the NMOS transistor. The single ended receiver further includes a pair of output transmission lines. Each one of the pair of output transmission lines is coupled to the drain regions on each one of the pair of cross coupled inverters. A single input transmission line coupled at a single input node to a source region for one of the NMOS transistor in the cross coupled inverters. A current mirror coupled to the single input node.

In another embodiment, an electronic system is provided which comprises a processor coupled to a memory device. The memory device comprises a plurality of memory cells, addressing circuitry and sense amplifiers. At least one sense amplifier includes a pseudo differential amplifier which has a pair of cross coupled inverters. Each inverter includes a p-channel metal oxide semiconductor (PMOS) transistor, a first n-channel metal oxide semiconductor (NMOS) transistor, and an output node. The output node in each one of the pair of cross coupled inverters couples a drain region for the PMOS transistor to a drain region for the first NMOS transistor. The at least one sense amplifier includes a single signal input node coupled to a source region for one of the first NMOS transistor in the pair of cross coupled inverters. The pseudo differential amplifier is able to convert a single ended input current received at the single signal input node into a differential input signal.

In another embodiment, an electronic system is provided which has a processor, a memory device, and a bus coupling the processor and the memory device. The memory device further includes a single ended amplifier. The single ended amplifier includes a pair of cross coupled metal oxide semiconductor field effect transistors (MOSFETs). A pair of signal output nodes is provided such that each one of the pair of signal output nodes is coupled to a drain region for each MOSFET in the cross coupled pair of MOSFETs. A single signal input node is coupled to a source region for one of the MOSFETs in the cross coupled pair of MOSFETs. A current mirror is coupled to the single signal input node and a source region for each one of the cross coupled pair of MOSFETs.

In another embodiment, an electronic system is provided which has a processor coupled to a memory device. The memory device comprises a plurality of memory cells, addressing circuitry and sense amplifiers. At least one sense amplifier including a pseudo differential amplifier. The pseudo differential amplifier has a pair of cross coupled transistors. A pair of output transmission lines is provided such that each one of the pair of output transmission lines is coupled to a drain region on each one of the pair of cross coupled transistors. A single signal input node is coupled to a source region for one of the pair of cross coupled transistors. In this embodiment, the single ended amplifier is able to provide an amplified output signal to the pair of output transmission lines when a single ended input current of less than 1.0 mA is received at the single signal input node.

In another embodiment, a method of operation for a single ended receiver is provided. The method includes receiving a single ended input current at a signal input node for the single ended receiver, and converting the single ended input current into a differential input signal.

In another embodiment, a method for operating an amplifier is provided. The method includes inputting a single ended input current to a signal input node of the amplifier. The method further includes outputting a differential voltage signal on a pair of output nodes on the amplifier in less than 300 ns.

In another embodiment, a method for operating an amplifier is provided. The method includes receiving a current signal at a single input node for the amplifier. The current signal is then converted into a differential input signal. The method further includes latching a differential output signal to a pair of output nodes on the amplifier. In this embodiment, receiving a current signal includes receiving a 1.0 mA current signal. In this embodiment, converting the current signal into a differential input signal includes using a current mirror coupled to the single input node for converting the current signal into a differential input signal. Also in this embodiment, latching the differential output signal to the pair of output nodes includes latching the differential output signal to the pair of output nodes in less than 300 ns.

In another embodiment, a method for operating a single ended amplifier is provided. The method includes receiving a single ended input current at a signal input node of the single ended amplifier. Receiving the single ended input current at a signal input node includes receiving a single ended input current of less than 1.0 mA. The method further includes amplifying the single ended input current.

In another embodiment, a method for operating an amplifier is provided. The method includes inputting a single ended input current into a single signal input node for the amplifier. The method includes amplifying the single ended input current. And, the method includes outputting a differential voltage signal on a pair of output nodes on the amplifier in less than 300 ns.

In another embodiment, a method for pseudo differential amplification is provided. The method includes receiving a current signal at a single input node of a pseudo differential amplifier. The method includes converting the current signal into a differential input signal. The method includes amplifying the single ended input current. And the method includes outputting a differential voltage signal on a pair of output nodes on the pseudo differential amplifier in less than 300 ns.

Figure 3:
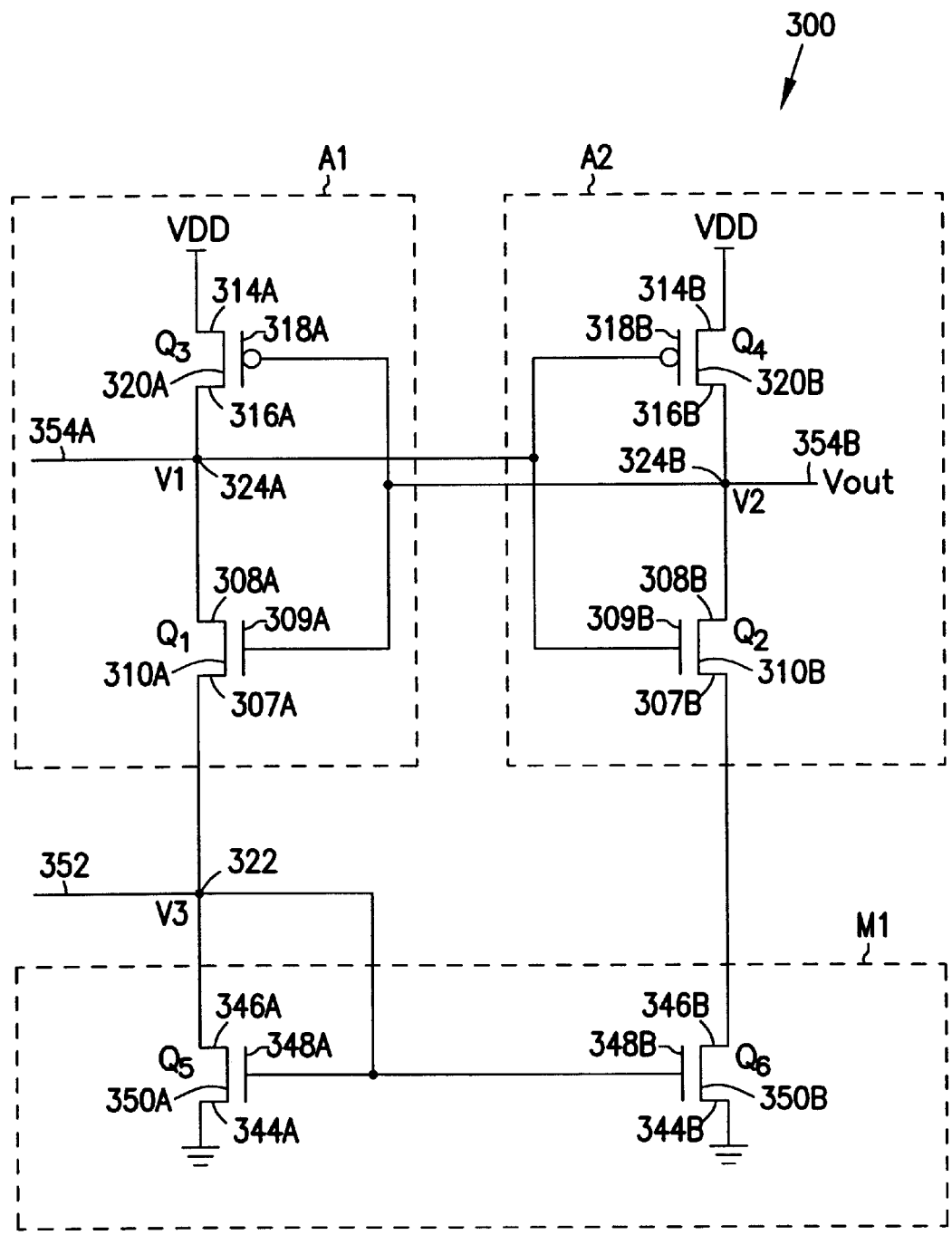
FIG. 3 is a schematic diagram illustrating a novel pseudo differential amplifier circuit, pseudo differential latch, or single ended receiver according to the teachings of the present invention.

FIG. 3 is a schematic diagram which illustrates a novel pseudo differential amplifier circuit, pseudo differential latch, or single ended receiver 300 according to the teachings of the present invention. FIG. 3 illustrates a pair of cross coupled amplifiers, A1 and A2. In the embodiment shown in FIG. 3, the pair of cross coupled amplifiers, A1 and A2, comprise two cross coupled inverters. Each amplifier, A1 and A2, includes a first transistor, Q1 and Q2 respectively, of a first conductivity type. Each first transistor Q1 and Q2 includes a source region, 307A and 307B respectively. Each first transistor Q1 and Q2 includes a drain region, 308A and 308B. Also, each first transistor Q1 and Q2 includes a gate, 309A and 309B, opposing a body region 310A and 3101B. Each amplifier, A1 and A2, includes a second transistor Q3 and Q4 of a second conductivity type. Each second transistor Q3 and Q4 includes a source region, 314A and 314B respectively. Each second transistor Q3 and Q4 includes a drain region, 316A and 316B. Also, each second transistor Q3 and Q4 includes a gate, 318A and 318B, opposing a body region 320A and 320B. In one embodiment, each first transistor, Q1 and Q2, of a first conductivity type includes a metal oxide semiconductor field effect transistor (MOSFET). In one embodiment, each first transistor, Q1 and Q2, of a first conductivity type includes an n-channel metal-oxide semiconductor (NMOS) transistor. In one embodiment, each second transistor, Q3 and Q4, of a second conductivity type includes a metal oxide semiconductor field effect transistor (MOSFET). In one embodiment, each second transistor, Q3 and Q4, of a second conductivity type includes a p-channel metal-oxide semiconductor (PMOS) transistor. In an exemplary embodiment, the NMOS and PMOS transistors are fabricated according to a complementary metal oxide semiconductor (CMOS) process technology.

In FIG. 3, a single signal input node 322 is coupled to the source region, 307A or 307B for one of the first transistors, Q1 and Q2, in the pair of cross coupled amplifiers A1 and A2. By way of illustration, and not by way of limitation, FIG. 3 shows the single signal input node 322 coupled to the source region 307A of transistor Q1. A signal output node 324A and 324B in each inverter A1 and A2 is coupled to the drain regions 308A and 308B of the first transistors Q1 and Q2 as well as to the drain regions 316A and 316B of each second transistor Q3 and Q4. The signal output nodes 324A and 324B in each one of the cross coupled inverters A1 and A2 is further coupled to the gates of the first and the second transistors in the other inverter. Hence, signal output node 324A is coupled to gates 309B and 318B of inverter A2, and signal output node 324B is coupled to gates 309A and 318A of inverter A1. In one embodiment, the signal output nodes 324A and 324B are coupled respectively to a pair of output transmission lines 354A and 354B. The single signal input node 322 is additionally coupled to a current mirror M1. In one embodiment, a transmission line 352 which has a characteristic impedance (Zo) of less than 50 Ohms is coupled to the signal input node 322.

In FIG. 3, a third transistor, Q5 and Q6 respectively, of a first conductivity type is coupled to each amplifier, A1 and A2. Each third transistor Q5 and Q6 includes a source region, 344A and 344B respectively. Each third transistor Q5 and Q6 includes a drain region, 346A and 346B. Also, each third transistor Q5 and Q6 includes a gate, 348A and 348B, opposing a body region 350A and 350B. The drain region 346A and 346B for each third transistor, Q5 and Q6, is coupled to the source region, 307A and 307B, for each first transistor Q1 and Q2 in the pair of cross coupled amplifiers A1 and A2. The single signal input node 322 additionally couples to the gate, 348A and 348B, for each third transistor Q5 and Q6. In one embodiment, each third transistor, Q5 and Q6, of a first conductivity type comprise a second pair of MOSFETs of a first conductivity type for the novel pseudo differential amplifier circuit 300. In this embodiment, the second pair of MOSFETs of a first conductivity type includes a pair of NMOS transistors Q5 and Q6. Also in this embodiment, the pair of NMOS transistors Q5 and Q6 are part of the current mirror M1. Here, a drain region, 346A and 346B, for each one of the pair of NMOS transistors Q5 and Q6 in the current mirror M1 is coupled to a source region, 307A and 307B respectively, for each NMOS transistor Q1 and Q2 in the pair of cross coupled inverters A1 and A2. The single signal input node 322 is coupled to a gate on each one of the pair of NMOS transistors Q5 and Q6 in the current mirror M1.

Figure 2:
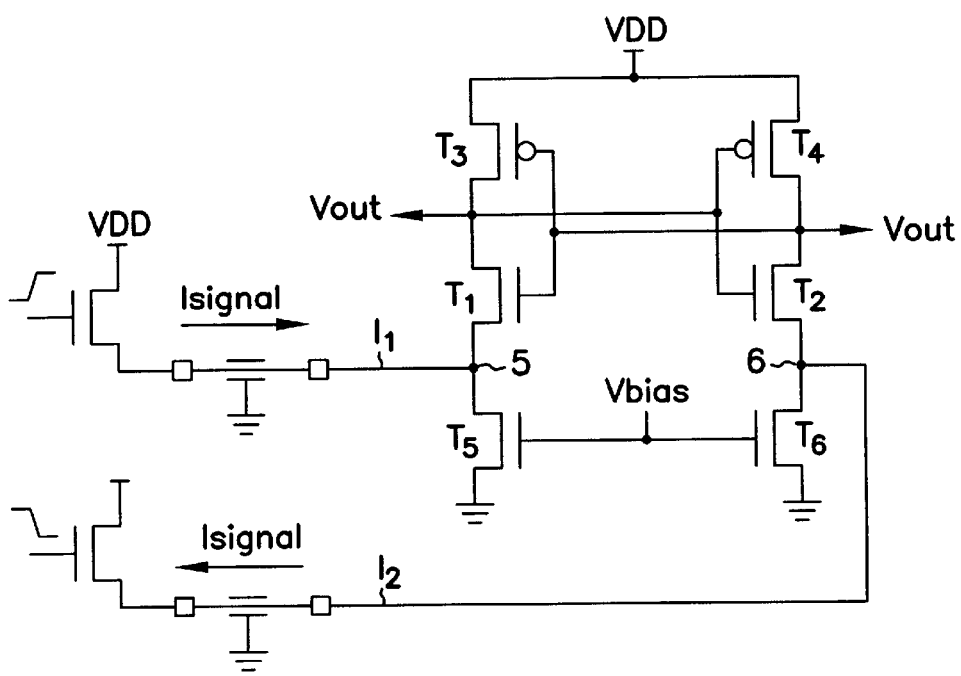
FIG. 2 is a schematic diagram illustrating differential current sense amplifier according to the teachings of the prior art.

FIG. 2 has been provided in illustration of a conventional differential current sense amplifier. In operation, the conventional differential current sense amplifier employs two input signal lines, I1 and I2 for fully differential signaling. In the illustration of FIG. 2, a signal current injected at node 5 causes the source current of transistor T1 to decrease. Likewise, a signal current being extracted from node 6 causes the source current of transistor T2 to increase. The ratio of the currents being injected into the source of T1 and the drain of T5 is determined by the input impedances looking into these terminals. Again, the problem has been stated that in certain circuit applications the requirement of two input signal lines I1 and I2 can quickly exhaust available chip surface area.

In contrast, the novel pseudo differential amplifier circuit of the present invention eliminates this spacial problem by facilitating differential sensing capability using a single ended receiver. The manner is which the same can be achieved is explained using FIG. 3. In FIG. 3, the two independent transistors, T5 and T6, shown at the bottom of FIG. 2 for the conventional differential current sense amplifier, have been replaced by current mirror M1. The current mirror M1 in FIG. 3 converts a single ended input current received at the single signal input node 322 into a differential input signal. In example, output node 324A and 324B are precharged to a voltage potential prior to the sensing operation. Next, a current signal is input from input transmission line 352 into single signal input node 322. When the current signal arrives at single signal input node 322 a portion of the signal flows into the gates 348A and 348B for transistors Q5 and Q6 serving to turn "on" these transistors. This creates conduction between source region 344A and drain region 346A of transistor Q5 as well as between source region 344B and drain region 346B of transistor Q6. If the input current signal flows into the drain region 346A of transistor Q5 then some current will also flow into the source region 307A of transistor Q1. The current flowing into the source region 307A of transistor Q1 will decrease the current flowing out of the drain region 316A of transistor Q3 and out of the source region 307A of transistor Q1. The precharged voltage potential, or node voltage V1, at output node 324A will subsequently increase which serves to turn transistor Q2 on and turn off transistor Q4. At the same time, an increase in the conduction between source region 344A and drain region 346A in transistor Q5 will cause the potential, or node voltage V3, at the signal input node 322 to increase which in turn increases the voltage on gate 348B of transistor Q6. An increasing gate voltage on transistor Q6 will further turn on transistor Q6 such that transistor Q6 conducts more current through transistor Q6 between drain region 346B and source region 344B. This increase in conduction through transistor Q6 will tend to cause the current flowing out of the source region 307B of transistor Q2 to increase. The increased conduction through transistors Q2 and Q6 tend to pull signal output node 324B to ground reducing the node voltage V2 at signal output node 324B. As the node voltage V2 of signal output node 324B is reduced, transistor Q3 is further turned on. In this manner, the single ended receiver, or pseudo differential amplifier circuit 300 operates in a differential amplifier fashion. The single ended current signal which was input from transmission line 352 into signal input 322 is thus converted into a differential current signal in that the source current at source region 307A of transistor Q1 tends to decrease and the source current at source region 307B of transistor Q2 tends to increase. In result, the novel pseudo differential amplifier of the present invention produces the same effect that a fully differential signal would have on a conventional differential current sense amplifier as that shown in FIG. 2. Meanwhile, the novel pseudo differential amplifier circumvents the necessity having two transmission lines as in a conventional differential current sense amplifier. The novel pseudo differential amplifier circuit 300 can latch a voltage output signal on the pair of signal output nodes, 324A and 324B, and thus the pair of output transmission lines 354A and 354B when a single sided current signal of 2.0 mA or less is received at the single signal input node 322. The novel pseudo differential amplifier circuit 300 can latch this voltage output signal to the pair of signal output nodes, 324A and 324B in less than 300 nanoseconds (ns). This is a very rapid response time on par with that provided by conventional differential current sense amplifiers. Further, the novel pseudo differential amplifier circuit described here is fully capable of fabrication in a streamlined CMOS process.

Figure 4:
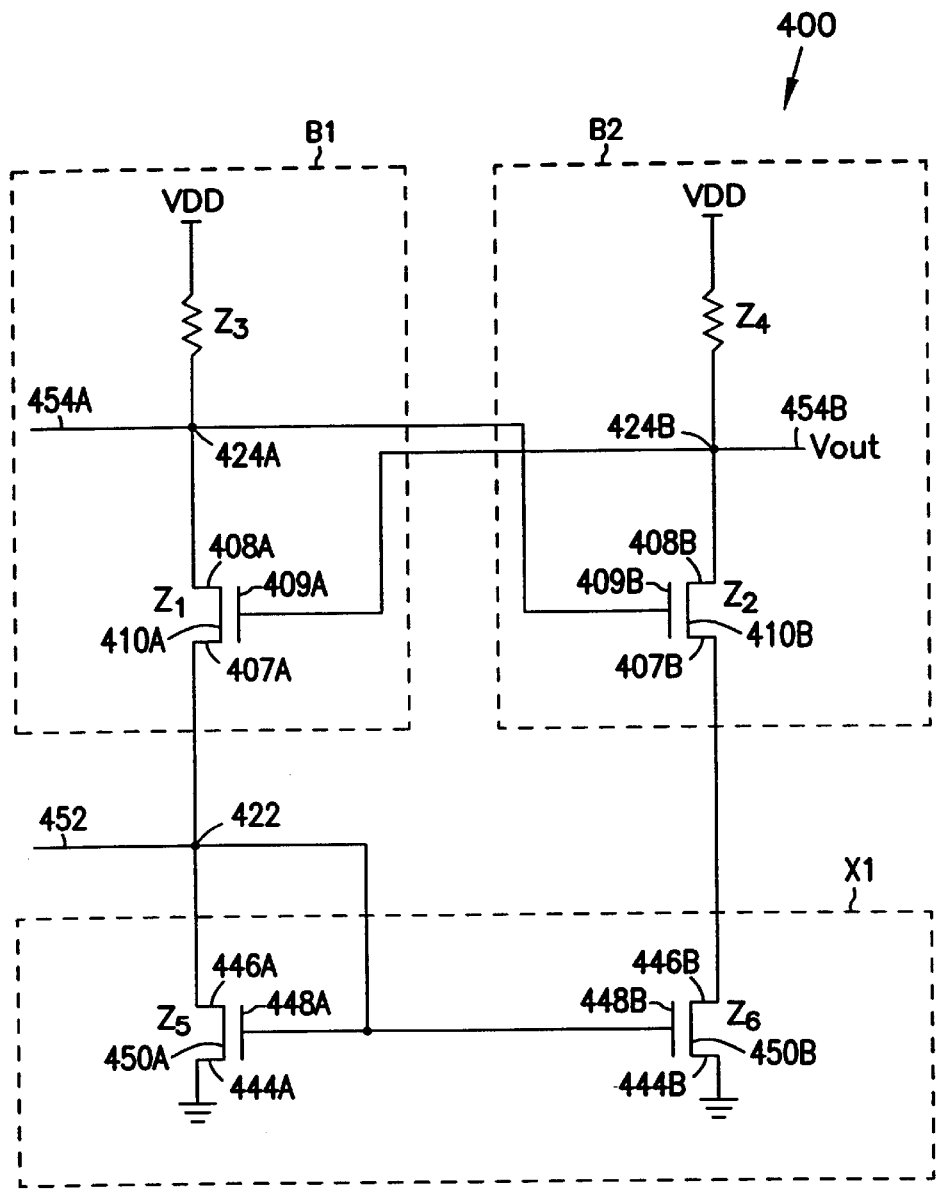
FIG. 4 is a schematic diagram illustrating another embodiment for a novel pseudo differential amplifier, or single ended amplifier according to the present invention.

FIG. 4 is a schematic diagram illustrating a novel pseudo differential current sense amplifier circuit, or single ended amplifier 400 according to the teachings of the present invention. The novel pseudo differential amplifier circuit 400 of FIG. 4 is applicable for uses in amplifier roles which don't require a latching action. FIG. 4 illustrates a pair of cross coupled amplifiers, B1 and B2. Each amplifier, B1 and B2, includes a first transistor, Z1 and Z2 respectively, of a first conductivity type. Each first transistor Z1 and Z2 includes a source region, 407A and 407B respectively. Each first transistor Z1 and Z2 includes a drain region, 408A and 408B. Also, each first transistor Z1 and Z2 includes a gate, 409A and 409B, opposing a body region 410A and 410B. Each amplifier, B1 and B2, includes a load resistor Z3 and Z4. Each load resistor Z3 and Z4 is coupled to the drain region for each one of the first transistors Z1 and Z2 respectively in the pair of cross coupled amplifiers B1 and B2. In one embodiment, each first transistor, Z1 and Z2, of a first conductivity type includes a pair, or first pair of metal oxide semiconductor field effect transistor (MOSFET). In one embodiment, each first transistor, Z1 and Z2, of a first conductivity type includes an n-channel metal-oxide semiconductor (NMOS) transistor.

In FIG. 4, a single signal input node 422 is coupled to the source region, 407A or 407B of one of the first transistors, Z1 and Z2, in the pair of cross coupled amplifiers B1 and B2. By way of illustration, and not by way of limitation, FIG. 4 shows the single signal input node 422 coupled to the source region 407A of transistor Z1. A signal output node 424A and 424B in each amplifier in the pair of cross coupled amplifiers B1 and B2 is coupled to the drain regions 408A and 408B of the first transistors Z1 and Z2 as well as to the load resistors Z3 and Z4. The signal output nodes 424A and 424B in each one of the cross coupled amplifiers B1 and B2 is further coupled to the gate of the first transistor in the other amplifier. Hence, signal output node 424A is coupled to gate 409B of amplifier B2, and signal output node 424B is coupled to gate 409A of amplifier B1. In one embodiment, the signal output nodes 424A and 424B are coupled respectively to a pair of output transmission lines 454A and 454B. The single signal input node 422 is additionally coupled to a current mirror X1. In one embodiment, a transmission line 452 which has a characteristic impedance (Zo) of less than 50 Ohms is coupled to the signal input node 422.

In FIG. 4, a second transistor, Z5 and Z6 respectively, of a first conductivity type is coupled to each amplifier, B1 and B2. Each second transistor Z5 and Z6 includes a source region, 444A and 444B respectively. Each second transistor Z5 and Z6 includes a drain region, 446A and 446B. Also, each second transistor Z5 and Z6 includes a gate, 448A and 448B, opposing a body region 450A and 450B. The drain region 446A and 446B for each second transistor, Z5 and Z6, is coupled to the source region, 407A and 407B, for each first transistor Z1 and Z2 in the pair of cross coupled amplifiers B1 and B2. The single signal input node 422 additionally couples to the gate, 448A and 448B, for each second transistor Z5 and Z6. In one embodiment, each second transistor, ZS and Z6, of a first conductivity type comprise a second pair of MOSFETs of a first conductivity type for the novel pseudo differential amplifier circuit 400. In this embodiment, the second pair of MOSFETs of a first conductivity type includes a pair of NMOS transistors Z5 and Z6. Also in this embodiment, the pair of NMOS transistors Z5 and Z6 are part of the current mirror X1. Here, a drain region, 446A and 446B, for each one of the pair of NMOS transistors Z5 and Z6 in the current mirror X1 is coupled to a source region, 407A and 407B respectively, for each NMOS transistor Z1 and Z2 in the pair of cross coupled amplifiers B1 and B2. The single signal input node 422 is coupled to a gate on each one of the pair of NMOS transistors Z5 and Z6 in the current mirror X1.

The operation of the pseudo differential amplifier circuit 400 in FIG. 4 is analogous to the operation of the pseudo differential amplifier circuit 400 in FIG. 3. And, like the circuit in FIG. 3, the novel pseudo differential amplifier circuit 400 conserves chip surface area by facilitating differential sensing capability using a single ended receiver. In the pseudo differential amplifier circuit 400 shown in FIG. 4 the amplifier action of the upper transistors Q3 and Q4 shown in FIG. 3 have been replaced by load resistors Z3 and Z4. The use of load resistors Z3 and Z4 rather than active transistors Q3 and Q4 as load devices results in a lower gain, slower response and more input current being required to achiever latching action if this is desired. Nonetheless, the pseudo differential amplifier circuit 400 is very well suited to and responsive in an amplifying signal detection role. The novel pseudo differential amplifier circuit 400 can provide a differential voltage signal to the pair of signal output nodes 424A and 424B and the pair of output transmission lines 454A and 454B when a single ended input current of less than 1.0 mA is received at the single signal input node 422. The novel pseudo differential amplifier circuit 400 can provide the differential voltage signal to the pair of signal output nodes in less than 300 nanoseconds (ns). This is a very rapid response time on par with that provided by conventional differential current sense amplifiers. The novel pseudo differential amplifier circuit 400 is fully capable of fabrication in a streamlined CMOS process. Further, since the pseudo differential amplifier circuit 400 operates with only a single signal input node and single input transmission line, precious chip surface area is conserved.

Figure 5:
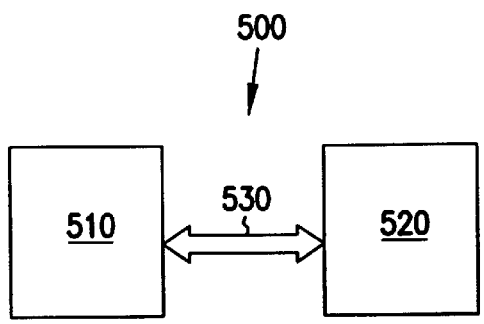
FIG. 5 is a block diagram illustrating an electronic system according to the teachings of the present invention.

FIG. 5 is a block diagram illustrating an electronic system 500 according to the teachings of the present invention. The electronic system 500 includes a processor, or processing unit 510 and a memory device 520, e.g. a random access memory (RAM). A bus 530 communicatively couples the central processing unit 510 and the memory device 520. In one embodiment, the bus 530 includes a system bus, a serial connection, or other bus. In one embodiment, the processor 510 and the memory device 520 are on a single semiconductor wafer. In an alternative embodiment, the processor 510 and the memory device 520 are on two separate semiconductor wafers. In one embodiment, the memory device 520 further includes a pseudo differential amplifier circuit as described and presented in detail above in connection with FIG. 3. In an alternative embodiment, the memory device 520 further includes a pseudo differential amplifier circuit as described and presented in detail above in connection with FIG. 4.

Figure 6:
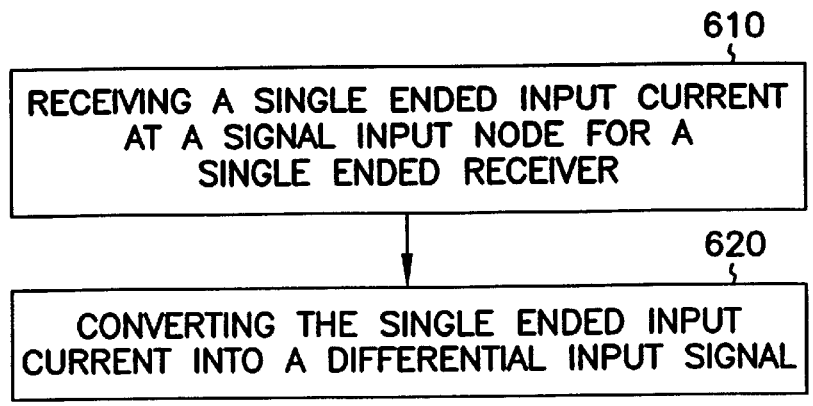
FIG. 6 illustrates, in flow diagram form, a method of operation for a single ended receiver according to the teachings of the present invention.

FIG. 6 illustrates, in flow diagram form, a method of operation for a single ended receiver according to the teachings of the present invention. The method includes receiving a single ended input current at a signal input node for the single ended receiver 610. The method further includes converting the single ended input current into a differential input signal 620. In one embodiment, receiving a single ended input current at a signal input node includes receiving a single ended input current of less than 5.0 mA. In an alternate embodiment, receiving a single ended input current at a signal input node includes receiving a single ended input current of less than 1.0 mA. In one embodiment, the method further includes-latching a voltage signal to a pair of output nodes on the single ended receiver in less than 300 ns when a single ended input current of less than 1.5 mA is received at the signal input node.

Figure 7:
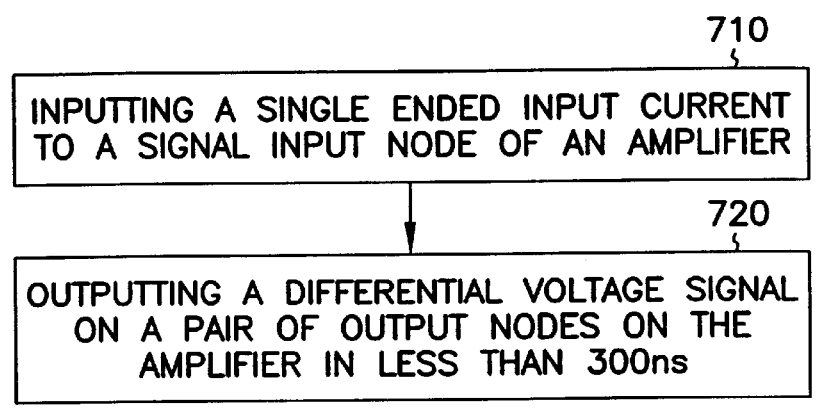
FIG. 7 illustrates, in flow diagram form, a method for operating an amplifier according to the teachings of the present invention.

FIG. 7 illustrates, in flow diagram form, a method for operating an amplifier according to the teachings of the present invention. The method includes inputting a single ended input current to a signal input node of the amplifier 710. The method further includes outputting a differential voltage signal on a pair of output nodes on the amplifier in less than 300 ns 720. In one embodiment, inputting a single ended input current includes inputting a 1.0 mA single ended input current. In one embodiment, outputting a differential voltage signal on the pair of output nodes includes latching the differential voltage signal on the pair of output nodes.

Figure 8:
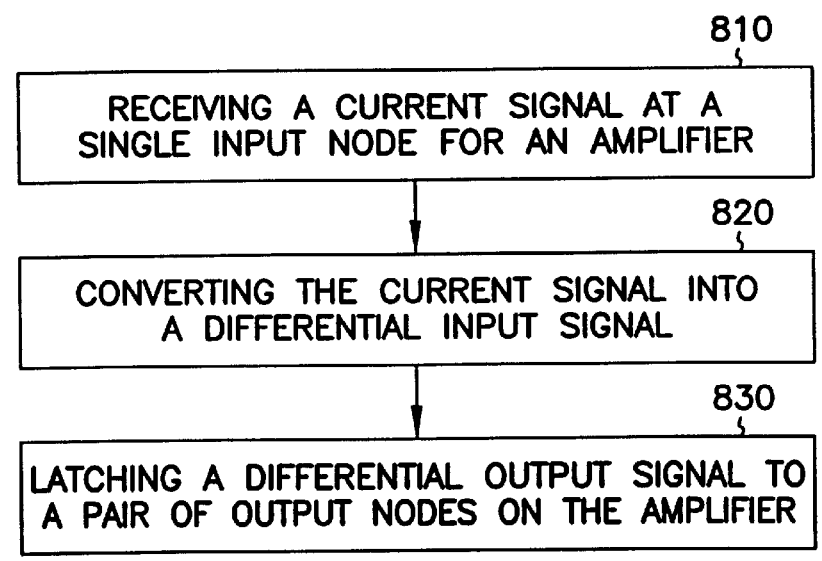
FIG. 8 illustrates, in flow diagram form, an alternative method for operating an amplifier according to the teachings of the present invention.

FIG. 8 illustrates, in flow diagram form an alternative method for operating an amplifier according to the teachings of the present invention. The method includes receiving a current signal at a single input node for the amplifier 810. The method includes converting the current signal into a differential input signal 820. The method further includes latching a differential output signal to a pair of output nodes on the amplifier 830. Converting the current signal into a differential input signal includes using a current mirror coupled to the single input node for converting the current signal into a differential input signal. In one embodiment, latching the differential output signal to the pair of output nodes includes latching the differential output signal to the pair of output nodes in less than 300 ns.

Figure 9:
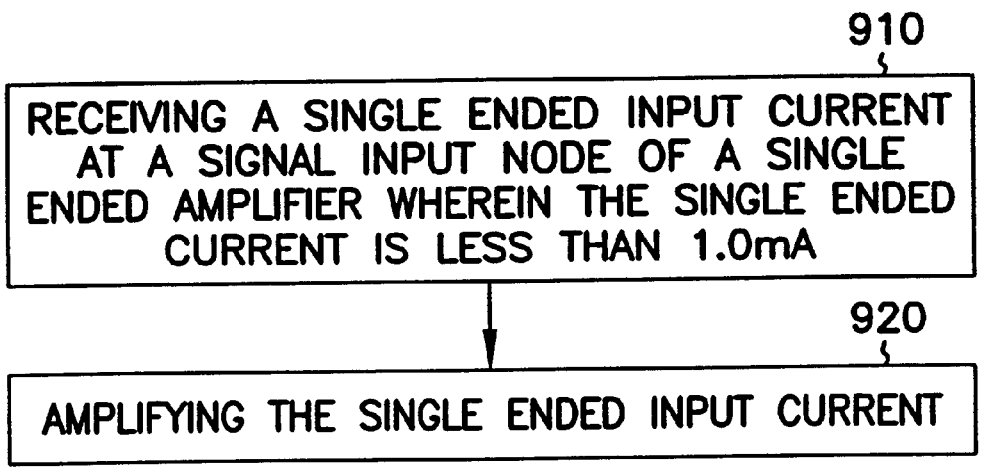
FIG. 9 illustrates, in flow diagram form, a method for operating a single ended amplifier according to the teachings of the present invention.

FIG. 9 illustrates, in flow diagram form, a method for operating a single ended amplifier according to the teachings of the present invention. The method includes receiving a single ended input current at a signal input node of the single ended amplifier 910. Receiving the single ended input current at a signal input node includes receiving a single ended input current of less than 1.0 mA. The method further includes amplifying the single ended input current 920.

Figure 10:
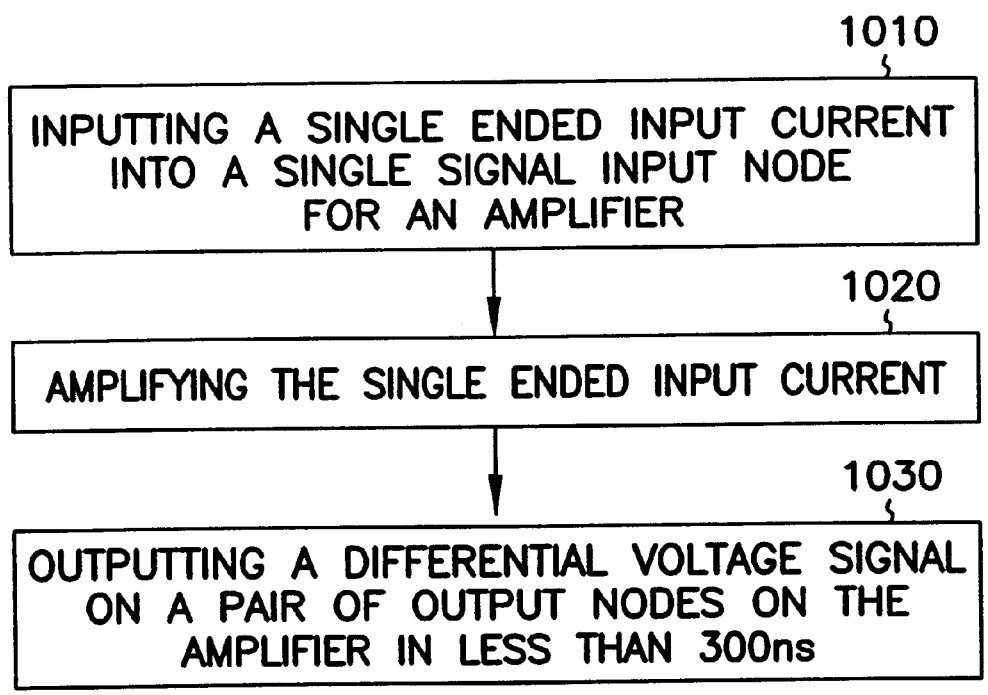
FIG. 10 illustrates, in flow diagram form, another method for operating an amplifier according to the teachings of the present invention.

FIG. 10 illustrates, in flow diagram form, another method for operating an amplifier according to the teachings of the present invention. The method includes inputting a single ended input current into a single signal input node for the amplifier 1010. The method further includes amplifying the single ended input current 1020. And, the method includes outputting a differential voltage signal on a pair of output nodes on the amplifier in less than 300 ns 1030. In one embodiment, inputting a single ended input current includes inputting a single ended input current of 0.5 mA or less.

Figure 11:
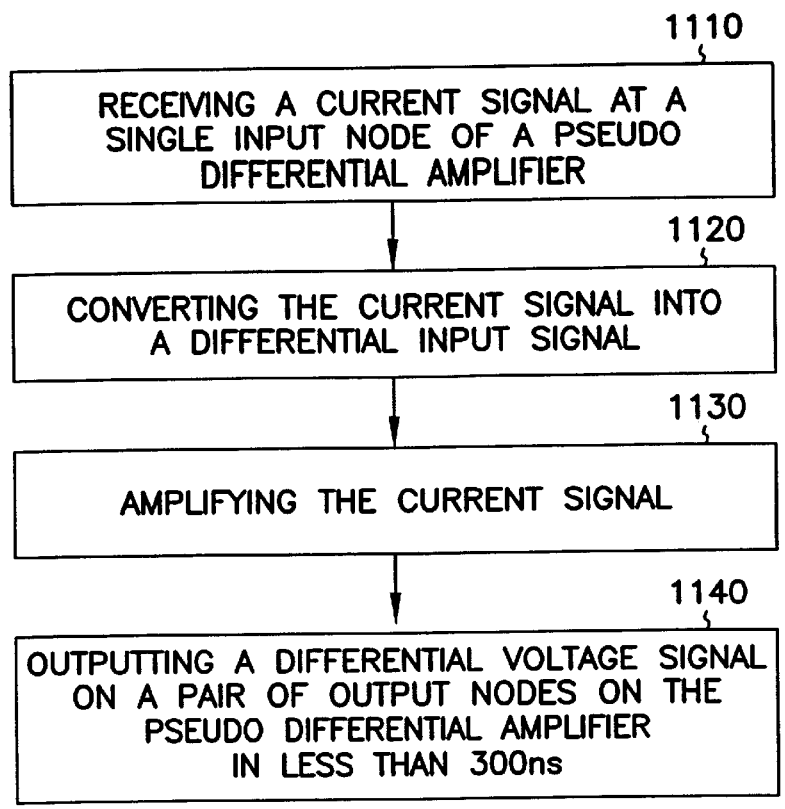
FIG. 11 illustrates, in flow diagram form, a method for pseudo differential amplification according to the teachings of the present invention.

FIG. 11 illustrates, in flow diagram form, a method for pseudo differential amplification according to the teachings of the present invention. The method includes receiving a current signal at a single input node of a pseudo differential amplifier 1110. The method includes converting the current signal into a differential input signal 1120. The method includes amplifying the single ended input current 1130. And, the method includes outputting a differential voltage signal on a pair of output nodes on the pseudo differential amplifier in less than 300 ns 1140.

Figure 12:
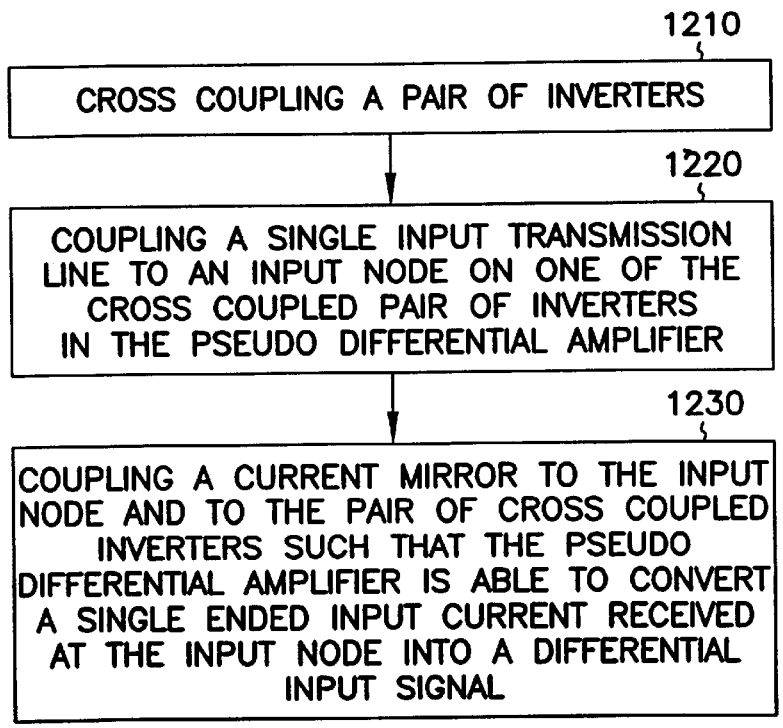
FIG. 12 illustrates, in flow diagram form, a method of forming a pseudo differential amplifier according to the teachings of the present invention.

FIG. 12 illustrates, in flow diagram form, a method of forming a pseudo differential amplifier according to the teachings of the present invention. The method includes cross coupling a pair of inverters 1210. The method includes coupling a single input transmission line to an input node on one of the cross coupled pair of inverters in the pseudo differential amplifier 1220. The method further includes coupling a current mirror to the input node and to the pair of cross coupled inverters 1230 such that the pseudo differential amplifier is able to convert a single ended input current received at the input node into a differential input signal.

Figure 13:
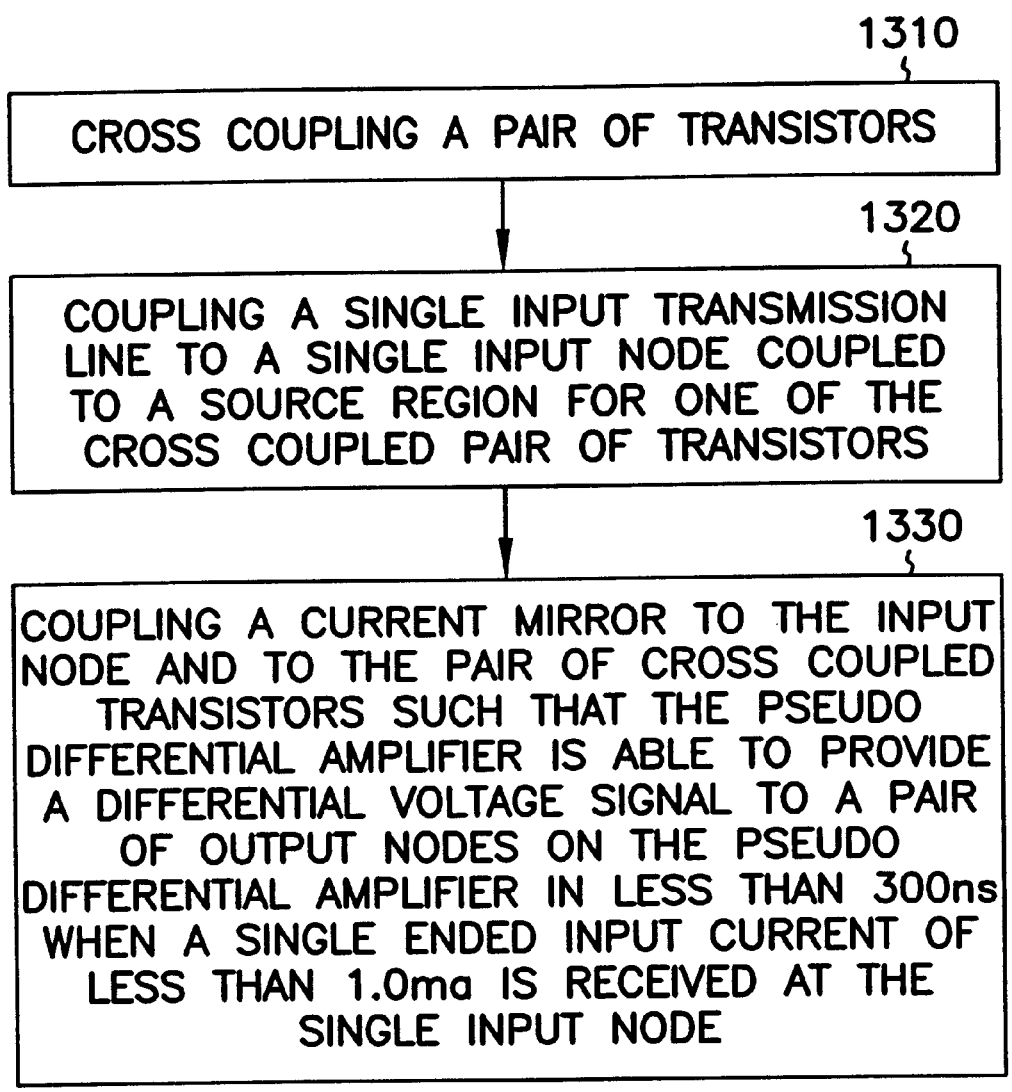
FIG. 13 illustrates, in flow diagram form, an alternative method of forming a pseudo differential amplifier according to the teachings of the present invention.

FIG. 13 illustrates, in flow diagram form, a method of forming a pseudo differential amplifier according to the teachings of the present invention. The method includes cross coupling a pair of transistors 1310. The method includes coupling a single input transmission line to an single input node coupled to a source region for one of the cross coupled pair of transistors 1320. The method includes coupling a current mirror to the single input node and to the pair of cross coupled transistors such that wherein the pseudo differential amplifier is able to provide a differential voltage signal to a pair of output nodes on the pseudo differential amplifier in less than 300 ns when a single ended input current of less than 1.0 mA is received at the single input node 1330.

CONCLUSION

Thus, novel structures and methods for improving differential amplifier operation on CMOS integrated circuits have been described. The novel single ended receivers and "pseudo differential" amplifiers are fabricated according to a streamlined CMOS process technology. The novel single ended receivers and "pseudo differential" amplifiers conserve scarce chip surface area yet still provide fast response times in a low power CMOS environment. The present invention yields a single ended receiver which is able to latch a voltage output signal on the pair of output transmission lines when a single ended current signal of 2.0 milliampere (mA) or less is received at the single signal input node. The present invention further yields a pseudo differential amplifier which can provide a differential voltage signal to a pair of signal output nodes when a single ended input current of 2.0 milliampere (mA) is received at the single signal input node.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A single ended receiver, comprising:
   a pair of cross coupled inverters;
   a pair of output transmission lines, wherein each respective one of the pair of output transmission lines is coupled to a drain region on a respective one of the pair of cross coupled inverters; and
   a single signal input node coupled to a source region for one of the pair of cross coupled inverters, wherein the single ended receiver is able to latch a voltage output signal on the pair of output transmission lines when a current signal of 2.0 milliampere (mA) or less is received at the single signal input node.

2. The single ended receiver of claim 1, wherein each of the transmission lines of the pair of output transmission lines coupled to the drain region on each one of the pair of cross coupled inverters is further coupled to a set of gates for the other one of the pair of cross coupled inverters.

3. The single ended receiver of claim 1, wherein each of the inverters in the pair of cross coupled inverters includes a p-channel metal oxide semiconductor (PMOS) transistor coupled to an n-channel metal oxide semiconductor (NMOS) transistor, wherein the PMOS transistor and the NMOS transistor in each inverter are coupled to one another at a drain region for the PMOS transistor and the NMOS transistor.

4. The single ended receiver of claim 1, wherein the single signal input node is further coupled to a current mirror.

5. A pseudo differential latch, comprising:
   a pair of cross coupled amplifiers, wherein each of the amplifiers comprises:
      a first transistor of a first conductivity type having a source region, a drain region, and a gate opposing a body region;
      a second transistor of a second conductivity type having a source region, a drain region, and a gate opposing a body region;
      a signal output node coupled to the drain regions for the first transistor and the second transistor, wherein each signal output node in each one of the cross coupled amplifiers is further coupled to the gates of the first and the second transistors in the other amplifier; and
      a third transistor of a first conductivity type having a source region, a drain region, and a gate opposing a body region, wherein the drain region is coupled to the source region of the first transistor; and a signal input node coupled to the source region for the first transistor in a first one of the cross coupled amplifiers, wherein the signal input node is further coupled to the gate in each third transistor.

6. The pseudo differential latch of claim 5, wherein the pseudo differential latch is able to latch a differential voltage signal to the signal output nodes when a current signal of 2.0 mA or less is received at the signal input node.

7. The pseudo differential latch of claim 5, wherein the first transistor of the first conductivity type includes an n-channel metal oxide semiconductor (NMOS) transistor, and wherein the second transistor of the second conductivity type includes a p-channel metal oxide semiconductor (PMOS) transistor.

8. The pseudo differential latch of claim 5, wherein the pseudo differential latch further includes a transmission line coupled to the signal input node, wherein the transmission line has a characteristic impedance of less than 50 Ohms.

9. A single ended receiver, comprising:
 a pair of cross coupled inverters, wherein each of the inverters includes:
  a p-channel metal oxide semiconductor (PMOS) transistor; and
  an n-channel metal oxide semiconductor (NMOS) transistor, wherein the PMOS transistor and the NMOS transistor are coupled to one another at a drain region for the PMOS transistor and the NMOS transistor;
 a pair of output transmission lines, wherein each respective one of the pair of output transmission lines is coupled to the drain regions on a respective one of the pair of cross coupled of inverters;
 a single input transmission line coupled directly at a single input node to a source region of the NMOS transistor in one of the cross coupled inverters; and
 a current mirror coupled to the single input node.

10. The single ended receiver of claim 9, wherein the current mirror includes a pair of NMOS transistors, wherein a drain region for a respective one of the pair of NMOS transistors is coupled to a source region for a respective NMOS transistor in the pair of cross coupled inverters, and wherein the single input node is coupled to a gate on each one of the pair of NMOS transistors.

11. The single ended receiver of claim 9, wherein each one of the pair of output transmission lines further couples the drain region for the PMOS transistor and the drain region for the NMOS transistor in a respective one of the cross coupled inverters to a gate of the PMOS transistor and a gate of the NMOS transistor in the other inverter.

12. A pseudo differential amplifier, comprising:
 a pair of cross coupled inverters, wherein each of the inverters includes:
  a p-channel metal oxide semiconductor (PMOS) transistor;
  a first n-channel metal oxide semiconductor (NMOS) transistor; and
  an output node, wherein the output node couples a drain region for the PMOS transistor to a drain region for the first NMOS transistor;
 a single signal input node coupled to a source region of the first NMOS transistor in one of the cross coupled inverters;
 wherein the pseudo differential amplifier is able to convert a single ended input current received at the single signal input node into a differential input signal; and
 wherein the pseudo differential amplifier is able to latch a voltage signal to the output nodes when a current signal of 1.0 mA or less is received at the single signal input node.

13. The pseudo differential amplifier of claim 12, wherein the single signal input node is further coupled to a current mirror.

14. The pseudo differential amplifier of claim 12, wherein a drain region for a second and a third NMOS transistor is coupled to a source region for the first NMOS transistor in a respective one of the inverters.

15. The pseudo differential amplifier of claim 14, wherein the single signal input node is further coupled to a gate on the second and the third NMOS transistor which are coupled to a respective one of the inverters respectively.

16. The pseudo differential amplifier of claim 12, wherein the output node on each one of the pair of cross coupled of inverters is coupled to a gate of the PMOS transistor and to a gate of the first NMOS transistor on the other inverter.

17. The pseudo differential amplifier of claim 12, wherein the pseudo differential amplifier is able to latch the voltage signal to the output nodes in less than 300 nano seconds (ns) from receiving an input signal at the single signal input node.

18. A single ended amplifier, comprising:
 a pair of cross coupled metal oxide semiconductor field effect transistors (MOSFETs);
 a pair of signal output nodes, wherein each one of the pair of signal output nodes is coupled to a drain region for a respective one of the MOSFETs in the respective cross coupled pair of MOSFETs;
 a single signal input node coupled to a source region for one of the MOSFETs in the cross coupled pair of MOSFETs;
 a current mirror coupled to the single signal input node and a source region for each one of the cross coupled pair of MOSFETs; and wherein the single ended amplifier is able to provide a differential voltage signal to the pair of signal output nodes in less than 300 ns from receiving an input signal at the single signal input node.

19. The single ended amplifier of claim 18, wherein each of the MOSFETs includes an n-channel MOSFET (NMOS).

20. The single ended amplifier of claim 18, wherein the single ended amplifier is able to provide a differential voltage signal to the pair of signal output nodes when a current signal of 0.5 mA or less is received at the single signal input node.

21. An amplifier circuit, comprising:
 a pair of cross coupled transistors;
 a pair of output transmission lines, wherein each respective one of the pair of output transmission lines is coupled to a drain region on a respective one of the pair of cross coupled transistors; and
 a single signal input node coupled to a source region for one of the pair of cross coupled transistors, wherein the amplifier circuit is able to provide a differential voltage signal to the pair of output transmission lines when a single ended input current of less than 1.0 mA is received at the single signal input node.

22. The amplifier circuit of claim 21, wherein each one of the pair of output transmission lines coupled to the drain region on a respective one of the pair of cross coupled transistors is further coupled to a gate for the other transistor in the pair of cross coupled transistors.

23. The amplifier circuit of claim 21, wherein each transistor in the pair of cross coupled transistors is an n-channel metal oxide semiconductor (NMOS) transistor.

24. The amplifier circuit of claim 21, wherein the single signal input node is coupled to a current mirror.

25. A pseudo differential amplifier, comprising:
- a first pair of metal oxide semiconductor field effect transistors (MOSFETs), wherein the first pair of MOSFETS are cross coupled;
- a pair of load resistors, wherein each of the respective load resistors is coupled to a drain region for a respective one of the MOSFETs in the first pair of MOSFETs;
- pair of signal output nodes, wherein each respective one of the pair of signal output nodes is coupled to the drain region for a respective one of the MOSFETs in the first pair of MOSFETs;
- a single signal input node coupled to a source region for one of the MOSFETs in the first pair of MOSFETs; and
- a second pair of MOSFETs, wherein a drain region for a respective one of the MOSFETs in the second pair of MOSFETs is coupled to a source region for a respective one of the MOSFETs in the first pair of MOSFETs, and wherein the single signal input node is coupled to a gate for each of the MOSFETs of the second pair of MOSFETs.

26. The pseudo differential amplifier of claim 25, wherein the pseudo differential amplifier is able to provide a differential voltage signal to the pair of signal output nodes when a current signal of 0.5 mA or less is received at the single signal input node.

27. The pseudo differential amplifier of claim 25, wherein the first pair of MOSFETs includes a first pair of n-channel metal oxide semiconductor (NMOS) transistors.

28. The pseudo differential amplifier of claim 27, wherein the second pair of MOSFETs includes a second pair of n-channel metal oxide semiconductor (NMOS) transistors.

29. The pseudo differential amplifier of claim 25, wherein the pseudo differential amplifier further includes a transmission line coupled to the single signal input node, wherein the transmission line has a characteristic impedance of less than 50 Ohms.

30. The pseudo differential amplifier of claim 25, wherein the drain region for each of the MOSFETs in the first pair of MOSFETs is coupled to a gate of the other MOSFET in the first pair of MOSFETs.

31. An amplifier circuit, comprising:
- a pair of cross coupled n-channel metal oxide semiconductor (NMOS) transistors;
- a pair of output transmission lines, wherein a respective one of the pair of output transmission lines coupled to a drain region on a respective one of the pair of cross coupled NMOS transistors;
- a single input transmission line coupled at a single input node to a source region on one of the NMOS transistors in the cross coupled pair of NMOS transistors; and
- a current mirror coupled to the signal input node such that the amplifier circuit is able to provide a differential voltage signal to the pair of signal output transmission lines when a 0.5 mA signal ended input current is received on the signal input transmission line.

32. The amplifier circuit of claim 31, the current mirror includes a pair of NMOS transistors, wherein a drain region for a respective one of the pair of NMOS transistors in the current mirror is coupled to a source region for a respective one of the NMOS transistors in the pair of cross coupled NMOS transistors, and wherein the single input node is coupled to a gate on each one of the pair of NMOS transistors in the current mirror.

33. The amplifier circuit of claim 31, wherein the drain region for each of the NMOS transistors in the pair of cross coupled NMOS transistors is coupled to a gate of the other NMOS transistors in the pair of cross coupled NMOS transistors.

34. A pseudo differential amplifier, comprising:
- a pair of cross coupled transistors;
- a pair of signal output nodes, wherein each respective one of the pair of signal output nodes is coupled to a drain region for a respective one of the transistors in the cross coupled pair of transistors;
- a single signal input node coupled to a source region for one of the transistors in the pair of cross coupled transistors; and
- wherein the pseudo differential amplifier is able to convert a single ended input current received at the single signal input node into a differential input signal, and wherein the pseudo differential amplifier is able to provide a differential voltage signal to the pair of signal output nodes when a 0.5 mA single ended input current is received at the single signal input node.

35. The pseudo differential amplifier of claim 34, wherein the single signal input node is further coupled to a current mirror as well as the pseudo differential amplifier such that the pseudo differential amplifier is able to convert the single ended input current received at the single signal input node into the differential input signal.

36. The pseudo differential amplifier of claim 34, wherein the pseudo differential amplifier further includes two n-channel metal oxide semiconductor (NMOS) transistors, wherein a drain region for a respective one of the NMOS transistors is coupled to a source region for a respective one of the transistors in the pair of cross coupled transistors.

37. The pseudo differential amplifier of claim 36, wherein the single signal input node is further coupled to a gate on each of the two NMOS transistors.

38. The pseudo differential amplifier of claim 34, wherein each one of the pair of signal output nodes coupled to a drain region for a respective one of the transistors in the cross coupled pair of transistors is further coupled to a gate of the other transistor in the cross coupled pair of transistors.

39. The pseudo differential amplifier of claim 34, wherein the pseudo differential amplifier is able to provide a differential voltage signal to the pair of signal output nodes when a 0.5 mA single ended input current is received at the single signal input node.

40. The pseudo differential amplifier of claim 34, wherein the pseudo differential amplifier is able to provide a differential voltage signal to the pair of signal output nodes in less than 300 nano seconds (ns) from receiving an input signal at the single signal input node.

41. A single ended amplifier, comprising:
- a pair of cross coupled amplifiers, wherein each of the amplifiers comprises:
  - a load resistor;
  - a first transistor having a source region, a drain region coupled to the load resistor, and a gate opposing a body region;
  - a signal output node coupled to the drain region for the first transistor; and
  - a second transistor having a source region, a drain region, and a gate opposing a body region, wherein the drain region of the second transistor is coupled to the source region of the first transistor; and
- a signal input node coupled to the source region for the first transistor in one of the cross coupled amplifiers, wherein the signal input node is further coupled to the gate in each of the second transistors.

42. The single ended amplifier of claim 41, wherein the single ended amplifier is able to provide an amplified output signal to the output nodes in the pair of cross coupled amplifiers when a 0.5 mA single ended input current is received at the single signal input node.

43. An electronic system, comprising:
   a processor;
   a memory device; and
   a bus coupling the processor and the memory device, the memory device including a single ended receiver wherein the single ended receiver includes:
      a pair of cross coupled inverters, wherein each of the inverters includes:
         a p-channel metal oxide semiconductor (PMOS) transistor; and
         an n-channel metal oxide semiconductor (NMOS) transistor, wherein the PMOS transistor and NMOS transistor are coupled to one another at a drain region for the PMOS transistor and the NMOS transistor;
      a pair of output transmission lines, wherein each respective one of the pair of output transmission lines is coupled to the drain region on a respective one of the pair of cross coupled of inverters;
      a single input transmission line coupled at a single input node to a source region for one of the NMOS transistors in the cross coupled inverters; and
      a current mirror coupled to the single input node such that the single ended receiver is able to provide a differential voltage signal to the pair of output transmission lines when a 0.5 mA single ended input current is received on the single input transmission line.

44. The electronic system of claim 43, wherein the current mirror includes a pair of NMOS transistors, wherein a drain region for each respective one of the pair of NMOS transistors in the current mirror is coupled to a source region for a respective one of the NMOS transistors in the pair of cross coupled inverters, and wherein the single input node is coupled to a gate on each one of the pair of NMOS transistors in the current mirror.

45. The electronic system of claim 43, wherein each one of the pair of output transmission lines further couples the drain region for the PMOS transistor and the drain region for the NMOS transistor in a respective one of the cross coupled inverters to a gate of the PMOS transistor and a gate of the NMOS transistor in the other inverter.

46. An electronic system, comprising:
   a processor; and
   a memory device coupled to the processor, comprising a plurality of memory cells, addressing circuitry and sense amplifiers, at least one sense amplifier including a pseudo differential amplifier, wherein the pseudo differential amplifier includes:
      a pair of cross coupled inverters, wherein each of the inverters includes:
         a p-channel metal oxide semiconductor (PMOS) transistor;
         a first n-channel metal oxide semiconductor (NMOS) transistor; and
         an output node, wherein the output node couples a drain region for the PMOS transistor to a drain region for the first NMOS transistor;
      a single signal input node coupled to a source region for one of the first NMOS transistors in the pair of cross coupled inverters; and wherein the pseudo differential amplifier is able to convert a single ended input current received at the single signal input node into a differential input signal, and wherein the pseudo differential amplifier is able to latch a voltage signal to the output nodes when a current signal of less than 2.0 mA is received at the single signal input node.

47. The electronic system of claim 46, the single signal input node is further coupled to a current mirror as well as the pseudo differential amplifier such that the pseudo differential amplifier is able to convert the single ended input current received at the single signal input node into the differential input signal.

48. The electronic system of claim 46, wherein a drain region for a second and a third NMOS transistors is coupled to a source region for the first NMOS transistor in a respective one of the inverters.

49. The electronic system of claim 48, wherein the single signal input node is further coupled to a gate on the second and the third NMOS transistor which are coupled to a respective one of the inverters.

50. The electronic system of claim 48, wherein the output node on a respective one of the pair of cross coupled of inverters is coupled to a gate of the PMOS transistor and to a gate of the first NMOS transistor on the other inverter.

51. The electronic system of claim 46, wherein the pseudo differential amplifier is able to latch a voltage signal to the output nodes in less than 300 nano seconds (ns) from receiving an input signal at the single signal input node.

52. An electronic system, comprising:
   a processor;
   a memory device; and
   a bus coupling the processor and the memory device, the memory device including a single ended amplifier wherein the single ended amplifier includes:
      a pair of cross coupled metal oxide semiconductor field effect transistors (MOSFETs);
      a pair of signal output nodes, wherein each respective one of the pair of signal output nodes is coupled to a drain region for a respective one of the MOSFETs in the cross coupled pair of MOSFETs;
      a single signal input node coupled to a source region for one of the MOSFETs in the cross coupled pair of MOSFETs; and
      a current mirror coupled to the single signal input node and a source region for each one of the cross coupled pair of MOSFETs, and wherein the single ended amplifier is able to latch a voltage signal to the pair of signal output nodes in less than 300 nano seconds (ns) from receiving an input signal at the single signal input node.

53. The electronic system of claim 52, wherein the current mirror includes a pair of n-channel MOSFETs, wherein a drain region for each respective one of the pair of n-channel MOSFETs in the current mirror is coupled to a source region for a respective one of the MOSFETs in the pair of cross coupled MOSFETs, and wherein the single input node is coupled to a gate on each one of the pair of n-channel MOSFETs in the current mirror.

54. The electronic system of claim 52, wherein each respective one of the pair of signal output nodes further couples the drain region for a respective one of the MOSFETs in the cross coupled pair of MOSFETs to a gate of the other of the respective MOSFETs in the cross coupled pair of MOSFETs.

55. An electronic system, comprising:
a processor; and
a memory device coupled to the processor, comprising a plurality of memory cells, addressing circuitry and sense amplifiers, at least one sense amplifier including a pseudo differential amplifier, wherein the pseudo differential amplifier includes:
  a pair of cross coupled transistors;
  a pair of output transmission lines, wherein each respective one of the pair of output transmission lines is coupled to a drain region on a respective one of the pair of cross coupled transistors; and
  a single signal input node coupled to a source region for one of the pair of cross coupled transistors, wherein the pseudo differential amplifier is able to provide an amplified output signal to the pair of output transmission lines when a single ended input current of less than 1.0 mA is received at the single signal input node.

56. The electronic system of claim 55, wherein the single signal input node is further coupled to a current mirror.

57. The electronic system of claim 55, wherein the pseudo differential amplifier is able to provide a differential voltage signal to the pair of output transmission lines in less than 300 nano seconds (ns) from receiving an input signal at the single signal input node.

58. A method of operation for a single ended receiver, comprising:
  receiving a single ended input current of less than 5.0 milliamperes at a signal input node for the single ended receiver;
  converting the single ended input current into a differential input signal; and
  latching a voltage signal to a pair of output nodes on the single ended receiver in less than 300 ns from receiving the single ended input current.

59. The method of claim 58, wherein the receiving a single ended input current at a signal input node includes receiving a single ended input current of less than 1.0 mA.

60. The method of claim 58, wherein latching the voltage signal to the pair of output nodes includes latching a voltage signal to the pair of output nodes in less than 300 ns when a single ended input current of less than 1.5 mA is received at the signal input node.

61. A method for operating an amplifier, comprising:
  inputting a single ended input current to a signal input node of the amplifier; and
  outputting a differential voltage signal on a pair of output nodes on the amplifier in less than 300 ns from receiving an input signal at the single signal input node.

62. The method of claim 61, wherein the inputting a single ended input current includes inputting a 1.0 mA single ended input current.

63. The method of claim 61 wherein the outputting a differential voltage signal on the pair of output nodes includes latching the differential voltage signal on the pair of output nodes.

64. A method for operating an amplifier, comprising:
  receiving a current signal of less than 5.0 milliamperes at a single input node for the amplifier;
  converting the current signal into a differential input signal; and
  latching a differential output signal to a pair of output nodes on the amplifier.

65. The method of claim 64, wherein the receiving a current signal includes receiving a 1.0 mA current signal.

66. The method of claims 64, wherein the converting the current signal into a differential input signal includes using a current mirror coupled to the single input node for converting the current signal into the differential input signal.

67. The method of claim 64, wherein the latching the differential output signal to the pair of output nodes includes latching the differential output signal to the pair of output nodes in less than 300 ns from receiving an input signal at the single signal input node.

68. A method for operating a single ended amplifier, comprising:
  receiving a single ended input current at a signal input node of the single ended amplifier, wherein the receiving the single ended input current at a signal input node includes receiving a single ended input current of less than 1.0 mA; and
  amplifying the single ended input current in less than 300 ns from receiving an input signal at the single signal input node.

69. A method for operating an amplifier, comprising:
  inputting a single ended input current to a single signal input node for the amplifier;
  amplifying the single ended input current; and
  outputting a differential voltage signal on a pair of output nodes on the amplifier in less than 300 ns from receiving an input signal at the single signal input node.

70. The method of claim 69, wherein the inputting a single ended input current includes inputting a single ended input current of 0.5 mA or less.

71. A method for pseudo differential amplification, comprising:
  receiving a current signal at a single input node of a pseudo differential amplifier;
  converting the current signal into a differential input signal;
  amplifying the current signal while converting the current signal into the differential input signal; and
  outputting a differential voltage signal on a pair of output nodes on the pseudo differential amplifier in less than 300 ns from receiving the current signal at the single input node.

72. The method of claim 71, wherein the receiving a current signal includes receiving a current signal of less than 1.0 mA.

73. The method of claim 71 wherein the converting the current signal into a differential input signal includes using a current mirror coupled to the single input node for converting the current signal into the differential input signal.

74. A method of forming a pseudo differential amplifier, comprising:
  cross coupling a pair of inverters;
  coupling a single input transmission line to an input node on one of the cross coupled pair of inverters in the pseudo differential amplifier;
  coupling a current mirror to the input node and to the pair of cross coupled inverters; and
  wherein the pseudo differential amplifier is able to convert a single ended input current received at the input node into a differential input signal when a single ended input current of less than 1.0 mA is received at the input node.

75. A method of forming a pseudo differential amplifier, comprising:
  cross coupling a pair of transistors;
  coupling a single input transmission line to an single input node coupled to a source region for one of the cross coupled pair of transistors;

coupling a current mirror to the single input node and to the pair of cross coupled transistors; and wherein the pseudo differential amplifier is able to provide a differential voltage signal to a pair of output nodes on the pseudo differential amplifier in less than 300 ns when a single ended input current of less than 1.0 mA is received at the single input node.

76. The method of claim 75, wherein the cross coupling the pair of transistors further includes coupling a drain region for each one of the pair of cross coupled transistors to a gate for the other transistor in the cross coupled pair of transistors.

* * * * *

UNITED STATES PATENT AND TRADEMARK OFFICE
CERTIFICATE OF CORRECTION

PATENT NO. : 6,377,084 B2
DATED : April 23, 2002
INVENTOR(S) : Forbes

It is certified that error appears in the above-identified patent and that said Letters Patent is hereby corrected as shown below:

<u>Title page,</u>
Item [56], under "OTHER PUBLICATIONS", delete "vol." and insert -- Vol. --, therefor.

<u>Column 2,</u>
Line 12, delete "provided a" and insert -- provides a --, therefor.
Line 20, delete "backpanes" and insert -- backplanes --, therefor.

<u>Column 4,</u>
Line 22, delete "fall" and insert -- full --, therefor.
Line 47, delete "farther" and insert -- further --, therefor.

<u>Column 5,</u>
Line 28, after "embodiment" insert -- , --.
Line 43, delete "MOSFETS" and insert -- MOSFETs --, therefor.

<u>Column 8,</u>
Line 17, delete "3101B" and insert -- 301B --, therefor.

<u>Column 11,</u>
Line 6, delete "firther" and insert -- further --, therefor.
Line 29, delete "ZS" and insert -- Z5 --, therefor.
Line 55, delete "achiever" and insert -- achieve -- therefor.

<u>Column 12,</u>
Line 36, delete "includes-latching" and insert -- includes latching --, therefor.

<u>Column 13,</u>
Line 43, delete "line to an" and insert -- line to a --, therefor.

<u>Column 16,</u>
Line 65, delete "each transistor" and insert -- each of the transistors --, therefor.

UNITED STATES PATENT AND TRADEMARK OFFICE
CERTIFICATE OF CORRECTION

PATENT NO. : 6,377,084 B2
DATED : April 23, 2002
INVENTOR(S) : Forbes

It is certified that error appears in the above-identified patent and that said Letters Patent is hereby corrected as shown below:

Column 17,
Line 5, delete "MOSFETS" and insert -- MOSFETs --, therefor.
Line 10, before "pair" insert -- a --.
Line 47, after "lines" insert -- is --, therefor.
Line 56, delete "signal" and insert -- single --, therefor.
Line 57, delete "signal" and insert -- single --, therefor.
Line 58, delete "31, the" and insert -- 31, wherein the --, therefor.

Column 18,
Line 2, delete "transistors" and insert -- transistor --, therefor.

Column 19,
Line 25, delete "coupled of" insert -- coupled --, therefor.

Column 22,
Line 44, after "71" insert -- , --.

Signed and Sealed this

Sixth Day of August, 2002

*Attest:*

JAMES E. ROGAN
*Director of the United States Patent and Trademark Office*

*Attesting Officer*